US007573106B2

(12) United States Patent
Saito

(10) Patent No.: US 7,573,106 B2
(45) Date of Patent: Aug. 11, 2009

(54) SEMICONDUCTOR DEVICE AND MANUFACTURING METHOD THEREFOR

(75) Inventor: Tomohiro Saito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 330 days.

(21) Appl. No.: 11/137,510

(22) Filed: May 26, 2005

(65) Prior Publication Data

US 2006/0102962 A1 May 18, 2006

(30) Foreign Application Priority Data

Nov. 12, 2004 (JP) ............................ 2004-328708

(51) Int. Cl.
*H01L 29/78* (2006.01)

(52) U.S. Cl. ........................ 257/377; 257/388; 257/412

(58) Field of Classification Search ......... 257/381-385, 257/388, 412-413, 455-456, 576, 754-757, 257/E21.438-E21.439; 438/581, 583, 630, 438/651, 682

See application file for complete search history.

(56) References Cited

U.S. PATENT DOCUMENTS 6,512,258 B2 * 1/2003 Maeda ....................... 257/303
6,562,718 B1 5/2003 Xiang et al.
6,905,922 B2 * 6/2005 Lin et al. .................... 438/199
7,067,881 B2 * 6/2006 Matsumoto et al. ......... 257/347
2003/0160198 A1 * 8/2003 Wieczorek et al. .......... 251/100
2003/0207555 A1 * 11/2003 Takayanagi et al. ......... 438/590
2005/0017310 A1 * 1/2005 Granneman et al. ......... 257/382
2005/0037558 A1 * 2/2005 Gong et al. ................. 438/197
2005/0130366 A1 * 6/2005 Lu ............................. 438/233
2005/0199963 A1 * 9/2005 Aoyama ..................... 257/369
2006/0022280 A1 * 2/2006 Cabral et al. ................ 257/382
2007/0057331 A1 * 3/2007 Satou et al. ................. 257/384
2008/0308877 A1 * 12/2008 Kinoshita et al. ........... 257/369

FOREIGN PATENT DOCUMENTS

JP 2000-058822 2/2000

* cited by examiner

*Primary Examiner*—Dao H Nguyen
*Assistant Examiner*—Tram H Nguyen
(74) *Attorney, Agent, or Firm*—Finnegan, Henderson, Farabow, Garrett & Dunner, L.L.P.

(57) ABSTRACT

A method of manufacturing a semiconductor device comprises forming a gate insulation film on a semiconductor substrate; forming a first gate electrode and a second gate electrode on the gate insulation film, the area of the second gate electrode on the surface of the semiconductor substrate being larger than that of the first gate electrode; selectively etching or grinding an upper part of the second gate electrode so that the thickness of the second gate electrode becomes smaller than the thickness of the first gate electrode; depositing a metal film on the first gate electrode and the second gate electrode; and siliciding the whole of the first gate electrode and the whole of the second gate electrode.

5 Claims, 24 Drawing Sheets

100···NICKEL FILM

115…SILICON NITRIDE FILM CAP 90
80
20
10
110
70
60
50
(RIE)
42
30
40

170···SILICON NITRIDE FILM CAP

SEMICONDUCTOR DEVICE AND MANUFACTURING METHOD THEREFOR

CROSS-REFERENCE TO RELATED APPLICATION

This application is based upon and claims the benefit of priority from the prior Japanese Patent Applications No. 2004-328708, filed on Nov. 12, 2004, the entire contents of which are incorporated herein by reference.

BACKGROUND OF THE INVENTION

1. Field of the Invention

The present invention relates to a semiconductor device and a method of manufacturing the same.

2. Background Art

Recently, manufacturing a MOSFET having its whole gate electrode silicided (hereinafter referred to as a full silicide) on a semiconductor substrate is considered.

However, MOSFETs that are formed on a same semiconductor substrate have different gate lengths and different gate widths among their gate electrodes, i.e., the gate electrodes are wide or narrow (large or small). The progress of a suicide process is different depending on the difference in the pattern of gate electrodes. Therefore, it is difficult to fully silicide gate electrodes of all patterns.

For example, silicidation progresses fast in the gate electrodes having a small area in their gate patterns. This is because in the silicidation process, much metal can be supplied from the periphery of the gate electrode. Therefore, in this case, the gate electrode can be easily fully silicided. On the other hand, silicidation progresses slowly in the gate electrodes having a large area in their gate patterns. This is because in the silicidation process, sufficient metal cannot be supplied from the periphery of the gate electrode. Therefore, in this case, the gate electrode cannot be easily fully silicided.

A method of manufacturing a semiconductor device that can fully suicide gate electrodes having various patterns is provided.

A semiconductor device having a gate electrode that has various patterns and that is fully silicided is provided.

SUMMARY OF THE INVENTION

A method of manufacturing a semiconductor device according to an embodiment of the present invention comprises forming a gate insulation film on a semiconductor substrate; forming a first gate electrode and a second gate electrode on the gate insulation film, the area of the second gate electrode on the surface of the semiconductor substrate being larger than that of the first gate electrode; selectively etching or grinding an upper part of the second gate electrode so that the thickness of the second gate electrode becomes smaller than the thickness of the first gate electrode; depositing a metal film on the first gate electrode and the second gate electrode; and siliciding the whole of the first gate electrode and the whole of the second gate electrode.

A method of manufacturing a semiconductor device according to an embodiment of the present invention comprises forming a gate insulation film on a semiconductor substrate; forming a first gate electrode and a second gate electrode on the gate insulation film, the area of the second gate electrode on the surface of the semiconductor substrate being larger than that of the first gate electrode; forming a mask material so as to expose an upper surface of the second gate electrode while keeping the first gate electrode covered; amorphizing an upper part of the second gate electrode by using the mask material as a mask; removing the mask material; depositing a metal film on the first and the second gate electrodes; and siliciding the whole of the first gate electrode and the whole of the second gate electrode.

A method of manufacturing a semiconductor device according to an embodiment of the present invention comprises forming a gate insulation film on a semiconductor substrate; depositing a gate electrode material on the gate insulation film; depositing a mask material on the gate electrode material; patterning the mask material and the gate electrode material to form a first gate electrode and a second gate electrode, the first gate electrode having the mask material on the upper surface thereof, the area of the second gate electrode on the surface of the semiconductor substrate being larger than that of the first gate electrode; depositing an inter-layer insulation film on the first and the second gate electrodes; exposing the mask material on the first and the second gate electrodes by polishing the inter-layer insulation film; forming trenches on the first and the second gate electrodes by removing the mask material; depositing a metal film on the first and the second gate electrodes; leaving the metal film in the trenches on the first and the second gate electrodes by polishing the metal film; siliciding the whole of the first gate electrode and the whole of the second gate electrode.

A method of manufacturing a semiconductor device according to an embodiment of the present invention comprises forming a gate insulation film on a semiconductor substrate; forming a first gate electrode and a second gate electrode on the gate insulation film, the area of the second gate electrode on the surface of the semiconductor substrate being larger than that of the first gate electrode; depositing a metal film on the first gate electrode and the second gate electrode; depositing a heat shielding film on the metal film; patterning the heat shielding film so as to expose the metal film on the second gate electrode while keeping the metal film on the first gate electrode covered; and siliciding the whole of the first gate electrode and the whole of the second gate electrode.

A semiconductor device according to an embodiment of the present invention comprises a semiconductor substrate; a gate insulation film provided on the semiconductor substrate; a first gate electrode provided on the gate insulation film, the first gate electrode being wholly silicided; and a second gate electrode provided on the gate insulation film, the second gate electrode being wholly silicided, the area of the second gate electrode on the surface of the semiconductor substrate being larger than that of the first gate electrode, and the thickness of the second gate electrode being thinner than that of the first gate electrode.

DETAILED DESCRIPTION OF THE INVENTION

Hereafter, embodiments of the present invention will be described in detail with reference to the drawings. Note that the invention is not limited to the embodiments.

First Embodiment

FIG. 1 to FIG. 4 are cross-sectional diagrams showing a flow of a method of manufacturing a semiconductor device according to a first embodiment of the present invention. For convenience sake, these diagrams show one MOSFET having a small surface area and one MOSFET having a large surface area on a semiconductor substrate 10. In actual practice, many of these MOSFETs are formed on a silicon substrate. Hereinafter, an area that occupies the surface of the semiconductor substrate 10 is simply referred to an "area".

Figure 1:
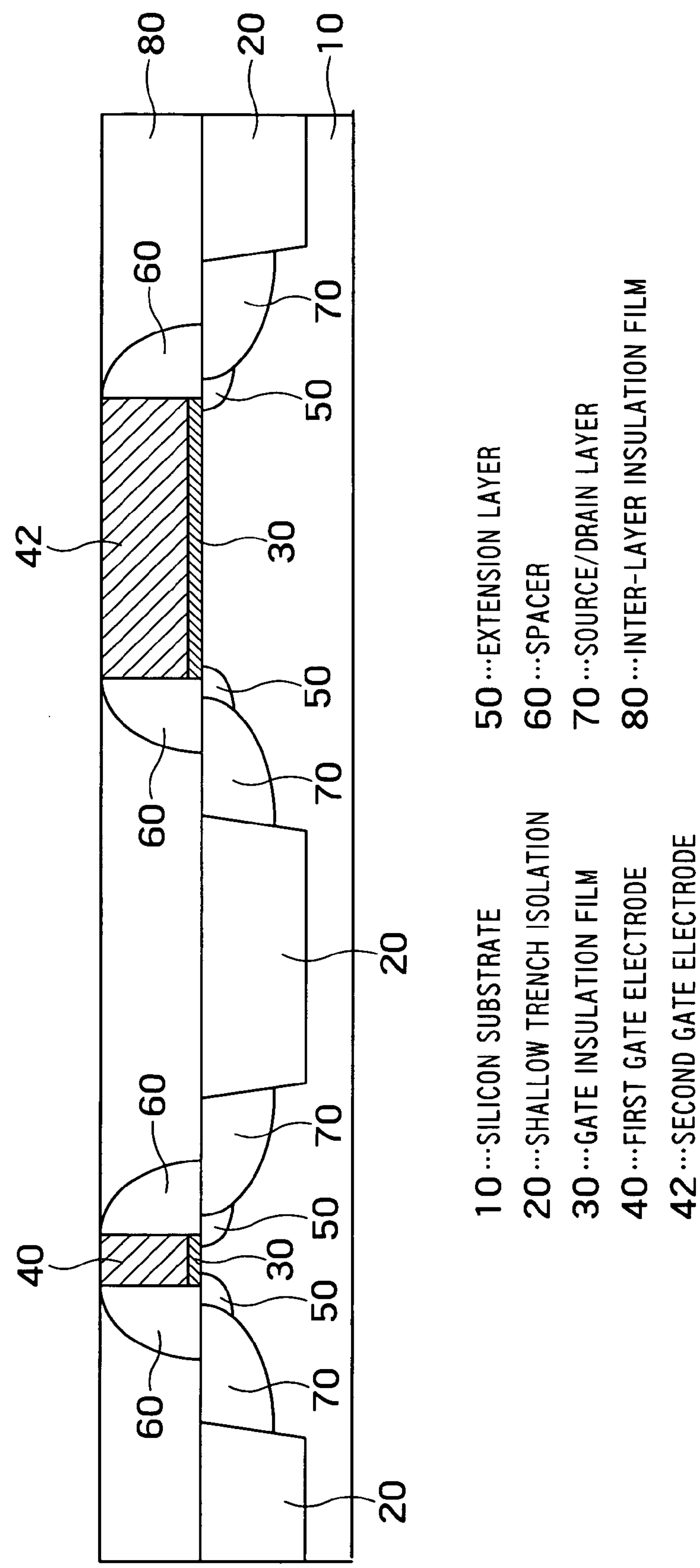
FIG. 1 is a cross-sectional diagram showing a method of manufacturing a semiconductor device according to a first embodiment of the present invention.

As shown in FIG. 1, an element isolation region STI (shallow trench isolation) 20 is first formed on the silicon substrate 10 as a semiconductor substrate. For example, a silicon oxide film and a silicon nitride film (not shown) are deposited on the silicon substrate 10. Next, the silicon nitride film is patterned using a photolithographic technique and an RIE (reactive ion etching) method, or the like. The silicon oxide film and the silicon substrate 10 are etched to a predetermined depth using the patterned silicon nitride film as a mask, thereby forming a trench. Then, a silicon oxide film is deposited on the surface of the silicon substrate 10, thereby filling the silicon oxide film within the trench. This silicon oxide film is flattened according to CMP (chemical mechanical polishing) or the like. The silicon nitride film is removed to complete the shallow trench isolation 20.

Next, a gate insulation film 30 is formed on the surface of the silicon substrate 10. For example, the silicon substrate 10 is thermally oxidized to form a thermally-oxidized film on the surface of the silicon substrate 10. The gate insulation film 30 may be an oxinitride film or a nitride film that is formed by further nitriding the thermally-oxidized film. Alternatively, the gate insulation film 30 may be a high dielectric film such as a hafnium oxide film or a hafnium silicate film. The thickness of the gate insulation film 30 is equal to or smaller than 3 nm, for example.

Next, a first gage electrode 40 and a second gate electrode 42 made of polysilicon are formed on the gate insulation film 30. For example, polysilicon is deposited on the gate insulation film 30. The thickness of the polysilicon is 100 nm, for example. This polysilicon is formed in a gate pattern using a photolithographic technique and anisotropic etching such as RIE. As a result, the first and the second gate electrodes 40 and 42 are formed, respectively. A gate length of the first gate electrode 40 is less than 0.3 μm, for example, and a gate length of the second gate electrode 42 is equal to or larger than 0.3 μm, for example. In place of polysilicon, amorphous silicon can be used for the material of the first and the second gate electrodes 40 and 42. For convenience sake, depths (i.e., gate widths) of the first and the second gate electrodes 40 and 42 are equal. Therefore, the area of the first gate electrode 40 on the surface of the silicon substrate 10 is larger than that of the second gate electrode 42.

Next, ion implantation is carried out to form an extension (LDD (lightly doped drain)) layer 50. Next, spacers 60 are formed on sidewalls of the first and the second gate electrodes 40 and 42, respectively, and ion implantation is carried out to form a source/drain layer 70. Annealing is carried out to recover from damage of the silicon substrate 10 due to the ion implantation and to activate impurity. As a result, the extension layer 50 and the source/drain layer 70 are formed. An inter-layer insulation film 80 such as a silicon oxide film is deposited on the surface, and this inter-layer insulation film 80 is flattened by using CMP or the like. In this case, the inter-layer insulation film 80 is ground until when the upper surfaces of the first and the second gate electrodes 40 and 42 are exposed.

Figure 2:
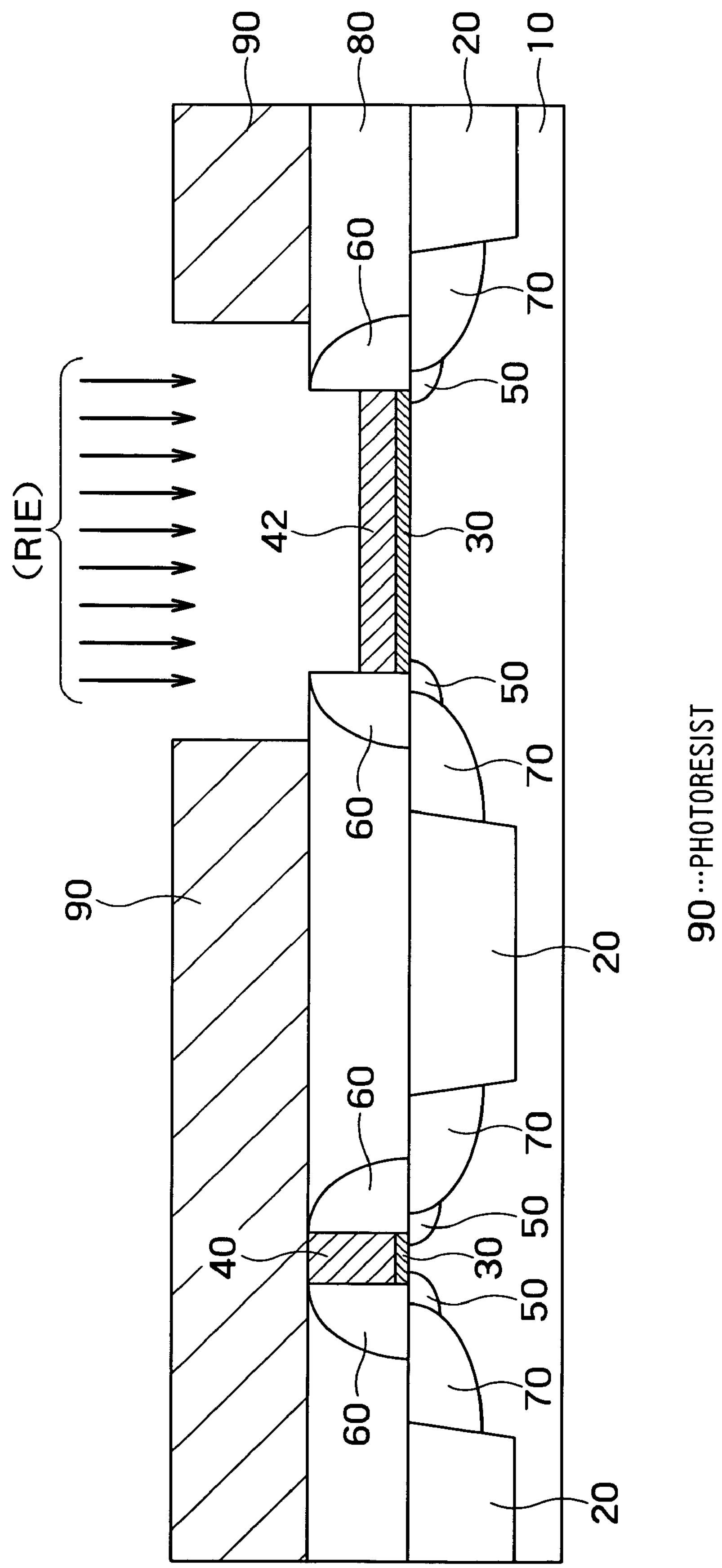
FIG. 2 is a cross-sectional diagram showing a method of manufacturing a semiconductor device following FIG. 1.

A photoresist 90 is coated as a mask material on the first and the second gate electrodes 40 and 42, respectively. As shown in FIG. 2, the photoresist 90 is patterned to expose the upper surface of the second gate electrode 42 while keeping the first gate electrode 40 covered with the photoresist 90. The second gate electrode 42 is etched according to RIE or the like by using the photoresist 90 as a mask. As a result, the thickness of the second gate electrode 42 becomes smaller than that of the first gate electrode 40. For example, the thickness of the second gate electrode 42 is 50 nm to 70 nm, and the thickness of the first gate electrode 40 is 100 nm.

Figure 3:
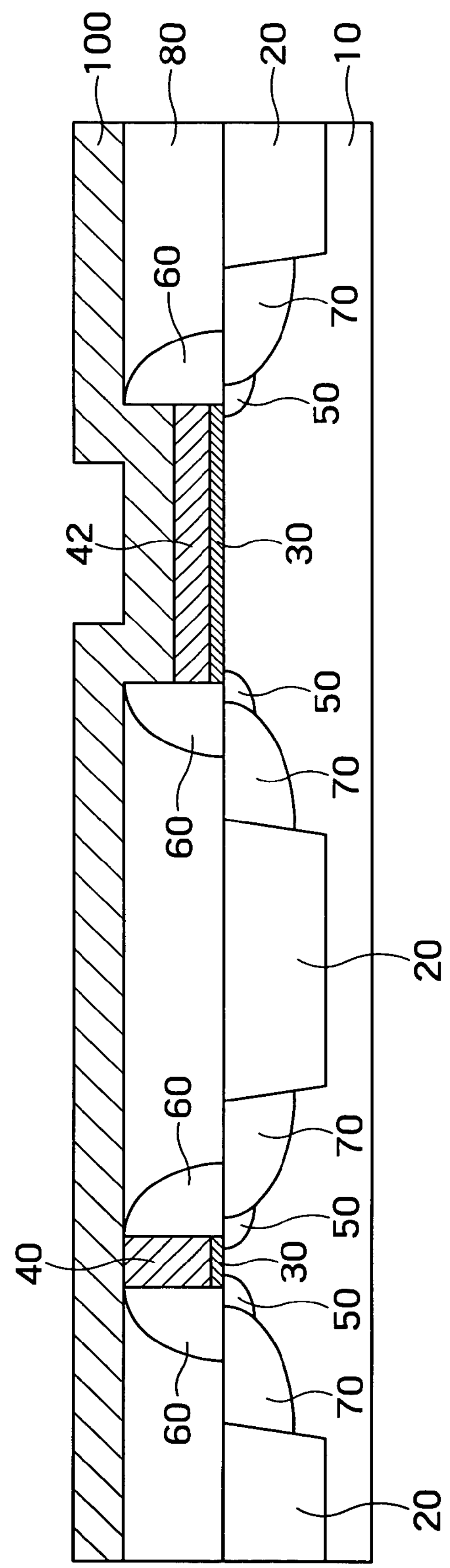
FIG. 3 is a cross-sectional diagram showing a method of manufacturing a semiconductor device following FIG. 2.
Figure 4:
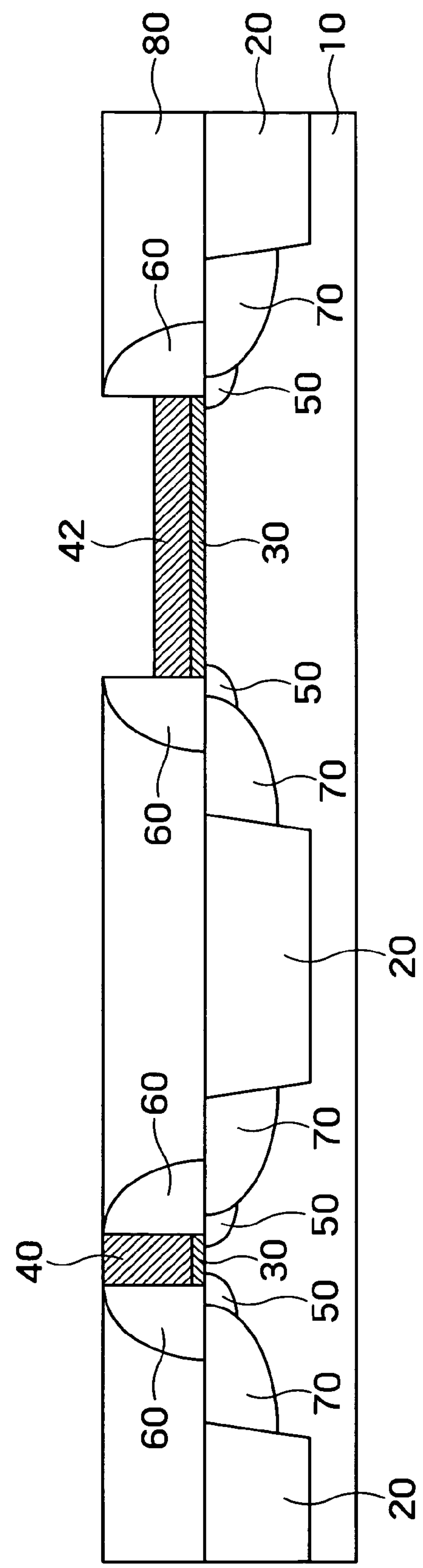
FIG. 4 is a cross-sectional diagram showing a method of manufacturing a semiconductor device following FIG. 3.

The photoresist 90 is removed, and the surface is precleaned. Next, as shown in FIG. 3, a nickel film 100 is deposited as a silicide metal film. The thickness of the nickel film 100 is 50 nm to 70 nm, for example. The first and the second gate electrodes 40 and 42, respectively, react with the nickel film 100 in an annealing process of about 500° C. As a result, nickel silicide is formed as a gate electrode. Since the area of the first gate electrode 40 is small and the area of the second gate electrode 42 is large, the second gate electrode 42 is less easily silicided than the first gate electrode. However, a film thickness of the second gate electrode 42 is smaller than that of the first gate electrode 40. Therefore, although quantity of metal supplied from the surrounding of the second gate electrode 42 is small, the second gate electrode 42 can be fully silicided. In this way, both the first gate electrode 40 and the second gate electrode 42 can be fully silicided, as shown in FIG. 4.

The subsequent manufacturing process is the same as a normal transistor forming process. For example, after an oxide film (not shown) is deposited as an inter-layer film, a contact and wiring are formed. As a result, a semiconductor device is completed.

The semiconductor device formed according to the first embodiment includes the semiconductor substrate 10, the gate insulation film 30, the first gate electrode 40, and the second gate electrode 42. The gate insulation film 30 is formed on the semiconductor substrate 10. The area of the second gate electrode 42 is larger than that of the first gate electrode 40. However, the film thickness of the second gate electrode 42 is set smaller than that of the first gate electrode 40. As a result, both the first gate electrode 40 and the second gate electrode 42 are fully silicided.

As explained above, the method of manufacturing a semiconductor device according to the first embodiment makes it possible to fully silicide gate electrodes having various patterns.

Modification of the First Embodiment

Figure 5:
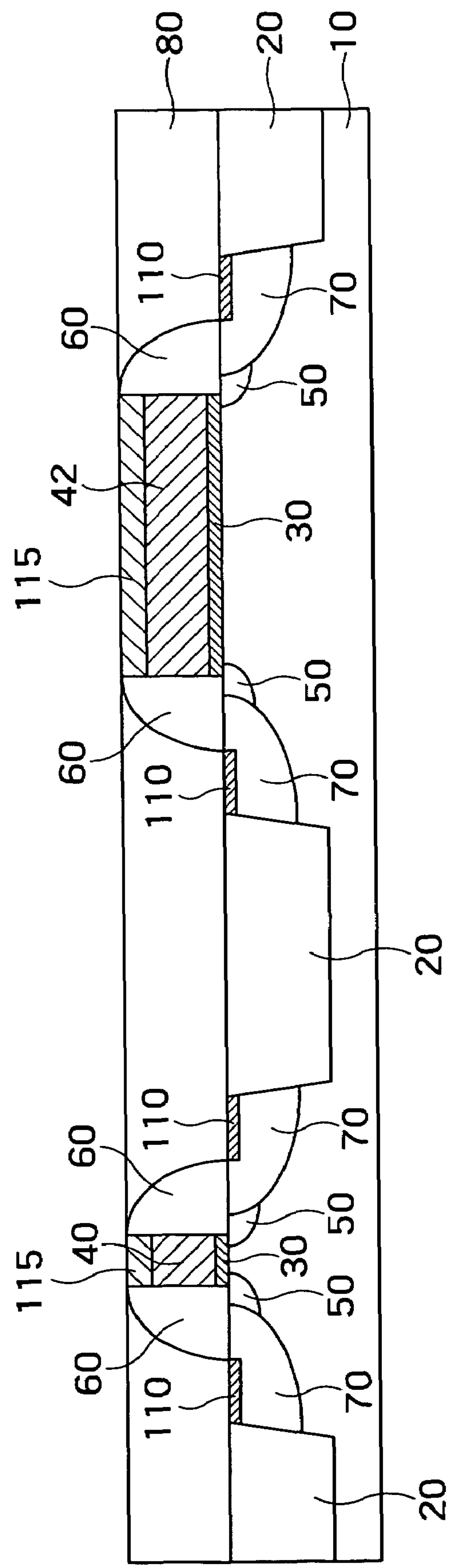
FIG. 5 is a cross-sectional diagram showing a modification of the first embodiment.

FIG. 5 to FIG. 9 show a modification of the first embodiment. In this modification, a silicide layer 110 is formed on the source/drain layer 70 as shown in FIG. 5. In the process of forming the silicide layer 110, silicon nitride film cap 115 is provided on the first gate electrode 40 and the second gate electrode 42 so that the first gate electrode 40 and the second gate electrode 42 are not silicided. A method of forming the first and the second gate electrodes 40 and 42 and the silicon nitride film cap 115 is as follows.

First, through a process similar to that according to the first embodiment, the gate insulation film 30 is formed on the silicon substrate 10. Next, a polysilicon film and a silicon nitride film are deposited on the gate insulation film 30. The polysilicon film and the silicon nitride film are formed in a gate pattern using a photolithographic technique and anisotropic etching such as RIE. As a result, the first and the second gate electrodes 40 and 42 and the silicon nitride film cap 115 are formed, as shown in FIG. 5. The silicon nitride film cap 115 covers the upper surfaces of the first and the second gate electrodes 40 and 42, respectively as silicidation restricting materials.

Next, a sidewall is formed according to needs, and the silicide layer 110 is formed on the source/drain layer 70. In this process, the silicon nitride film cap 115 prevents the first and the second gate electrodes 40 and 42 from being silicided.

Figure 6:
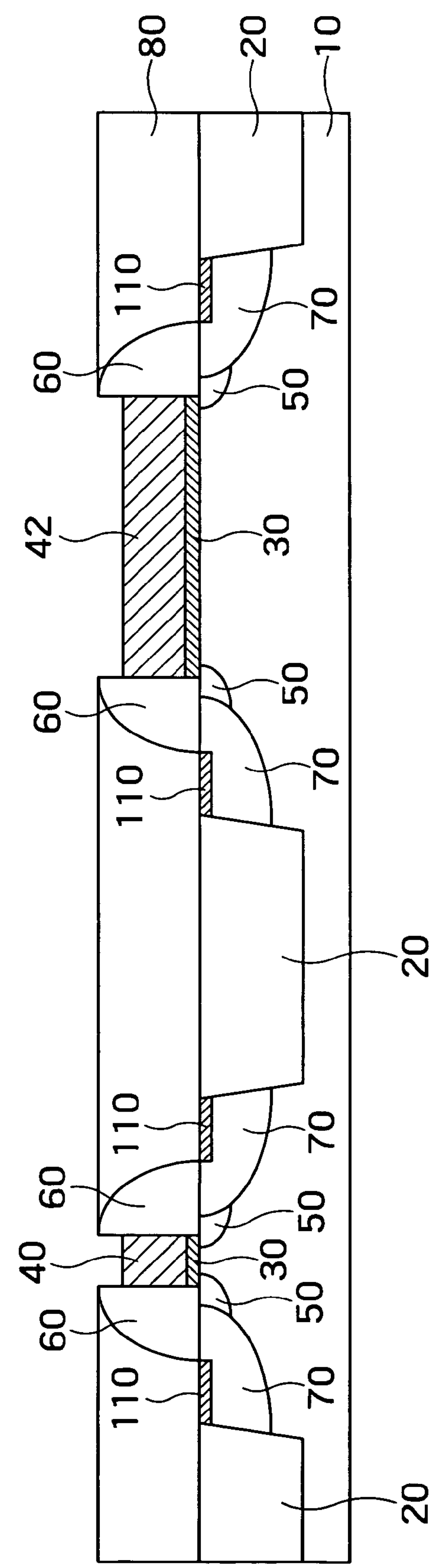
FIG. 6 is a cross-sectional diagram showing a method of manufacturing a semiconductor device following FIG. 5.
Figure 7:
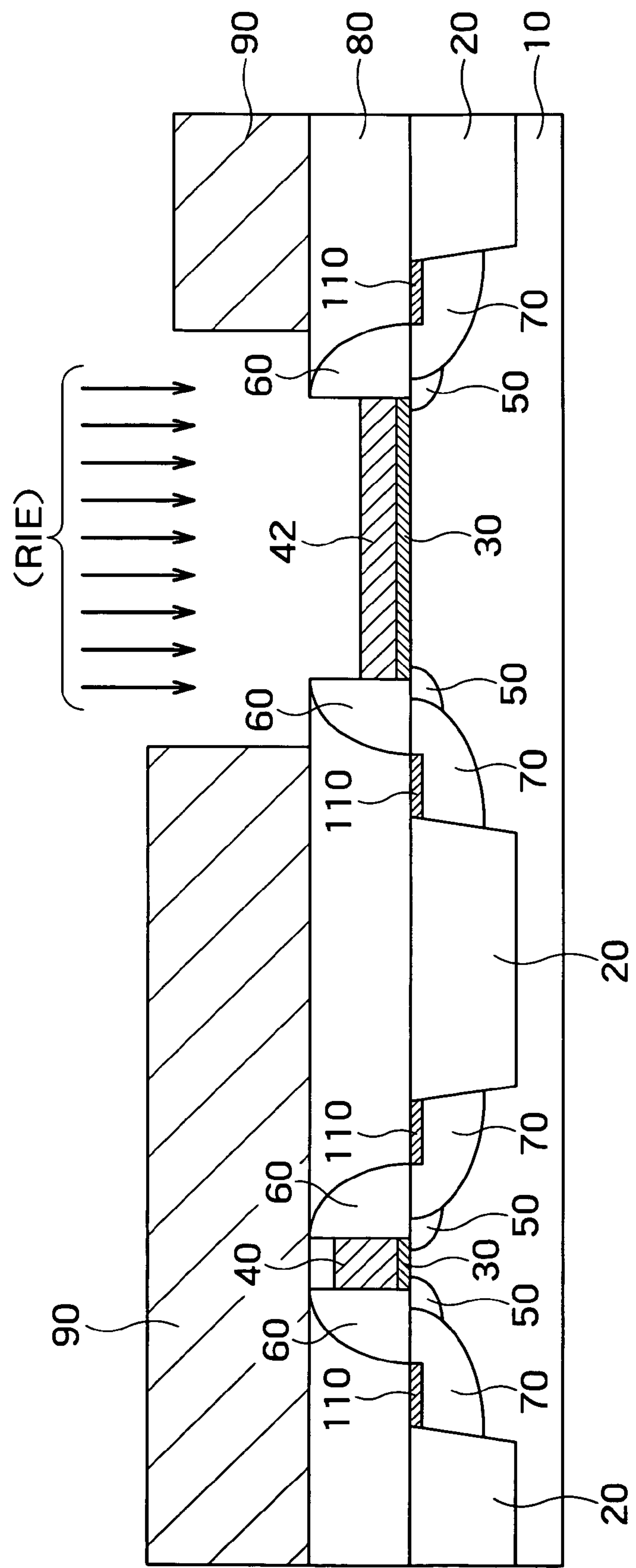
FIG. 7 is a cross-sectional diagram showing a method of manufacturing a semiconductor device following FIG. 6.

Next, as shown in FIG. 6, the silicon nitride film cap 115 is removed. Next, the photoresist 90 is deposited as a mask material on the first and the second gate electrodes 40 and 42, respectively. As shown in FIG. 7, the photoresist 90 is patterned to expose the upper surface of the second gate electrode 42 while keeping the first gate electrode 40 covered with the photoresist 90. The second gate electrode 42 is etched by RIE or the like using the photoresist 90 as a mask. As a result, the thickness of the second gate electrode 42 becomes smaller than that of the first gate electrode 40.

Figure 8:
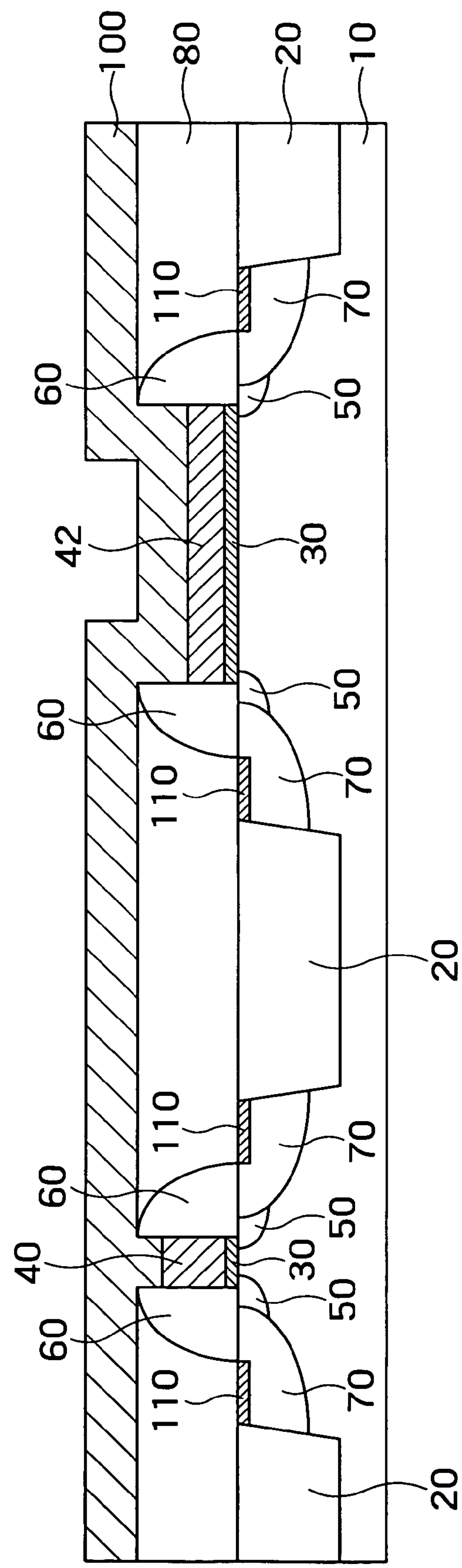
FIG. 8 is a cross-sectional diagram showing a method of manufacturing a semiconductor device following FIG. 7.
Figure 9:
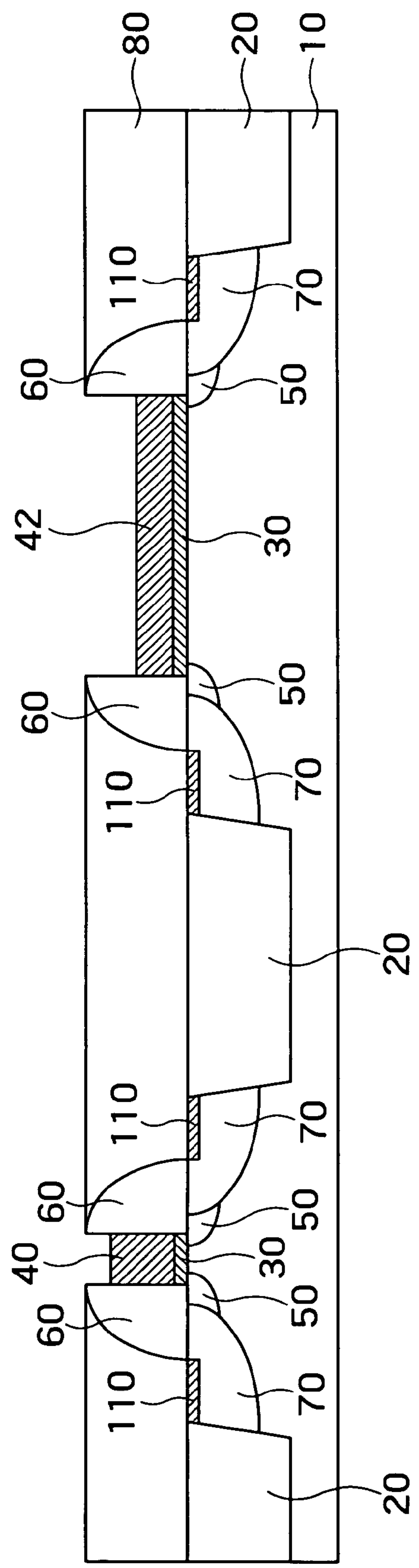
FIG. 9 is a cross-sectional diagram showing a method of manufacturing a semiconductor device following FIG. 8.

The photoresist 90 is then removed in a similar manner to that according to the first embodiment, and the nickel film 100 is deposited as a silicide metal film, as shown in FIG. 8. The first and the second gate electrodes 40 and 42 are reacted with the nickel film 100 in an annealing process. As a result, both the first and the second gate electrodes 40 and 42 can be fully silicided, as shown in FIG. 9. Thereafter, a semiconductor device may be completed in a manufacturing process similar to that according to the first embodiment.

The words of "full silicide" and "fully silicide" mean that it is not necessary to suicide full of the gate electrode absolutely, but it is sufficient to silicide the gate electrode substantially from the top surface to the bottom surface of the gate electrode.

Other Modification of the First Embodiment

Figure 10:
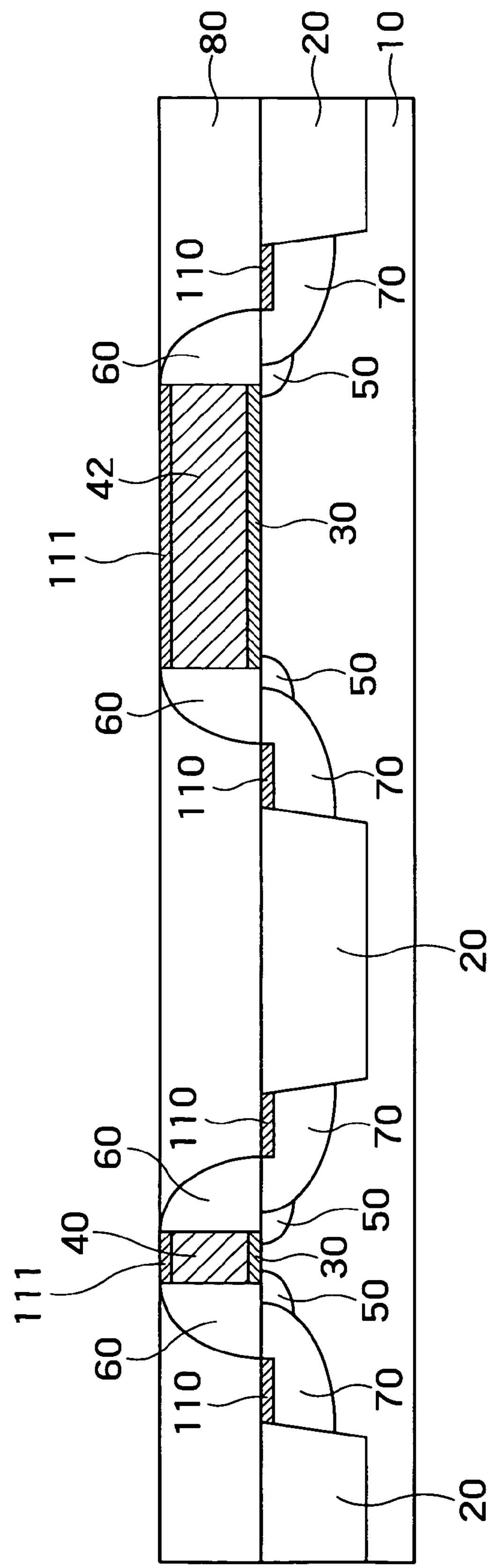
FIG. 10 is a cross-sectional diagram showing another modification of the first embodiment.
Figure 11:
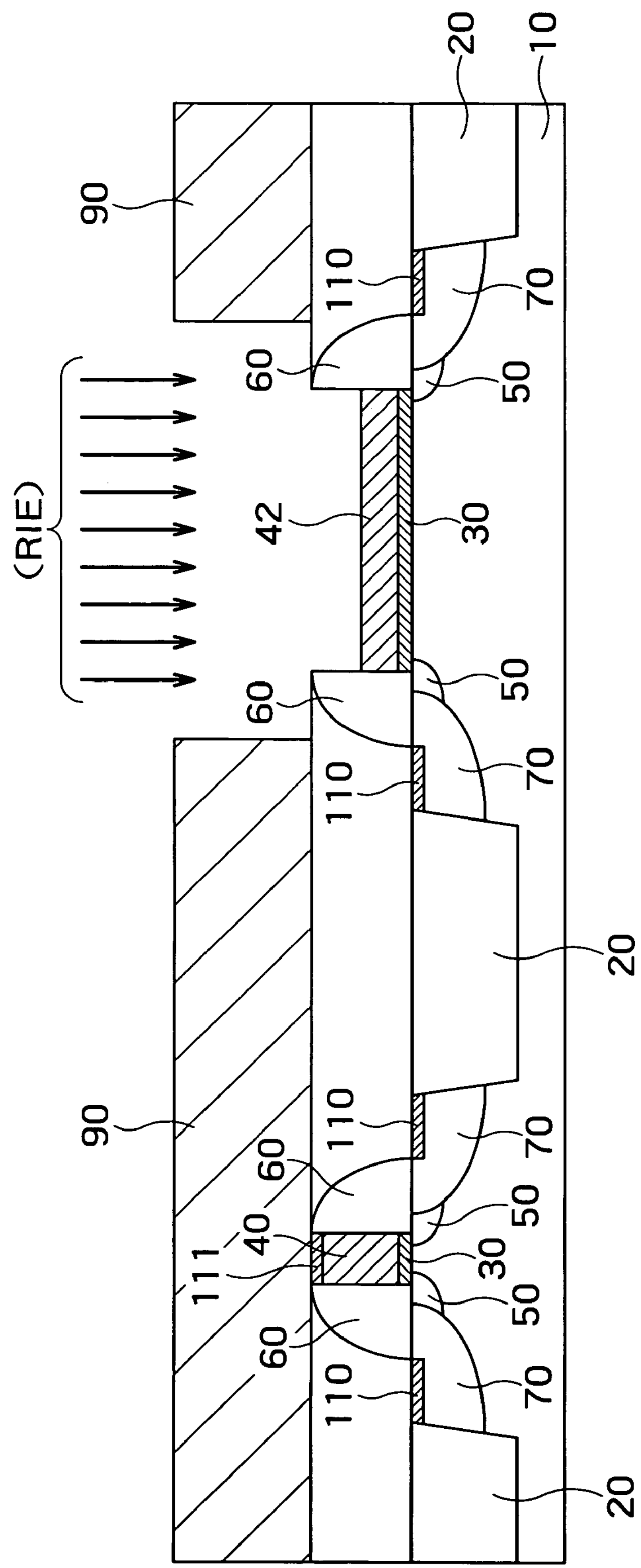
FIG. 11 is a cross-sectional diagram showing a method of manufacturing a semiconductor device following FIG. 10.
Figure 12:
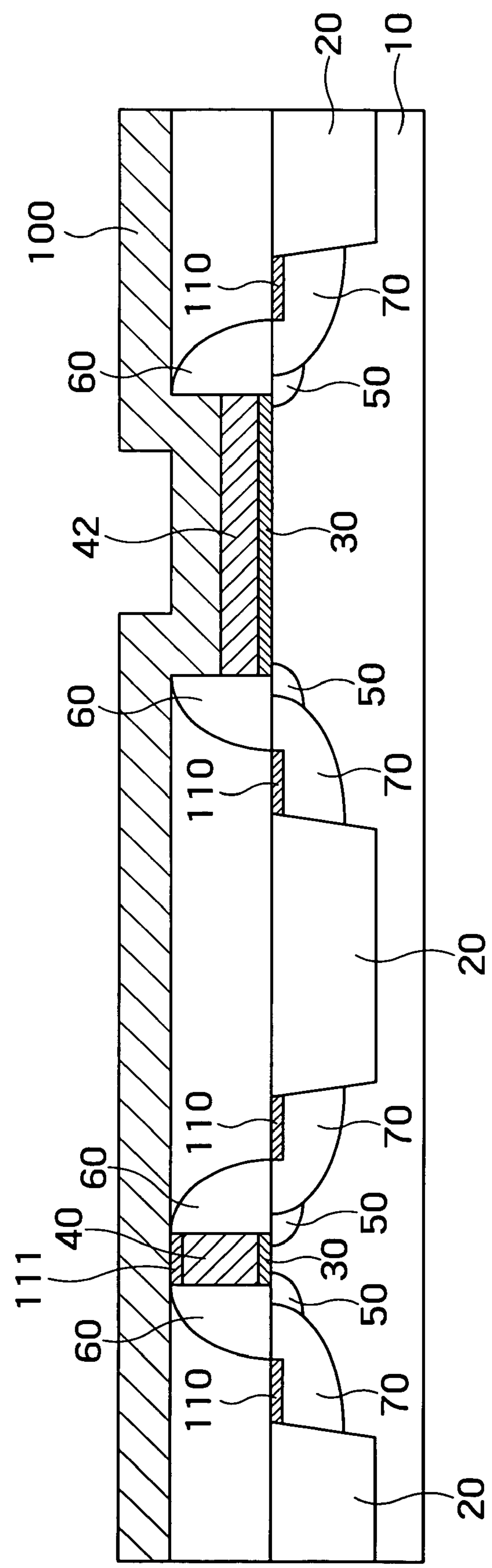
FIG. 12 is a cross-sectional diagram showing a method of manufacturing a semiconductor device following FIG. 11.

FIG. 10 to FIG. 12 show other modification of the first embodiment. According to this modification, a configuration as shown in FIG. 9 is formed without using a silicon nitride film cap. In the process of forming the silicide layer 110, silicide 111 is formed on the first gate electrode 40 and the second gate electrode 42. The inter-layer insulation film 80 is then deposited, and is planarized according to CMP, thereby exposing the upper surface of the silicide 111.

Next, the photoresist 90 is deposited as a mask material on the first and the second gate electrodes 40 and 42, respectively. As shown in FIG. 11, the photoresist 90 is patterned to expose the upper surface of the second gate electrode 42 while keeping the first gate electrode 40 covered with the photoresist 90. The silicide 111 on the second gate electrode 42 and the second gate electrode 42 are etched by RIE or the like using the photoresist 90 as a mask. As a result, the thickness of the second gate electrode 42 becomes smaller than that of the first gate electrode 40.

The photoresist 90 is thereafter removed in a similar manner to that according to the first embodiment, and the nickel film 100 is deposited as a silicide metal film, as shown in FIG. 12. The first and the second gate electrodes 40 and 42 are reacted with the nickel film 100 in an annealing process. As a result, the configuration as shown in FIG. 9 is obtained. Thereafter, a semiconductor device may be completed in a manufacturing process similar to that according to the first embodiment.

Second Embodiment

Figure 13:
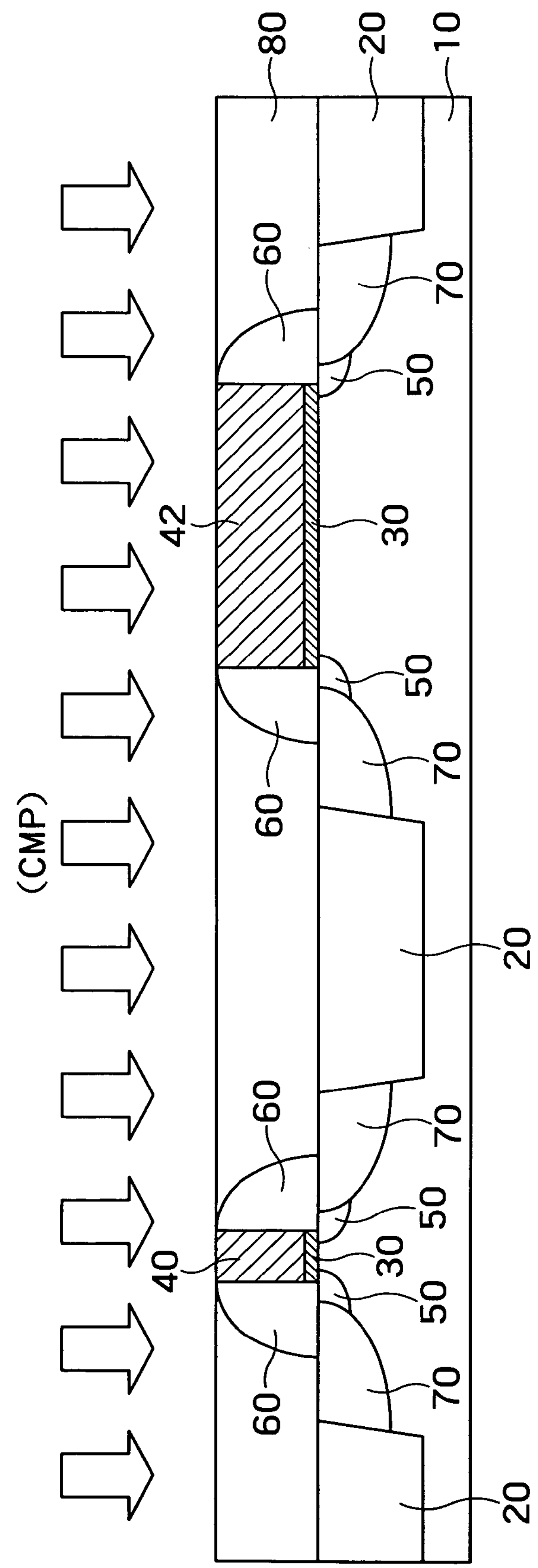
FIG. 13 is a cross-sectional diagram showing a method of manufacturing a semiconductor device according to a second embodiment of the present invention.
Figure 14:
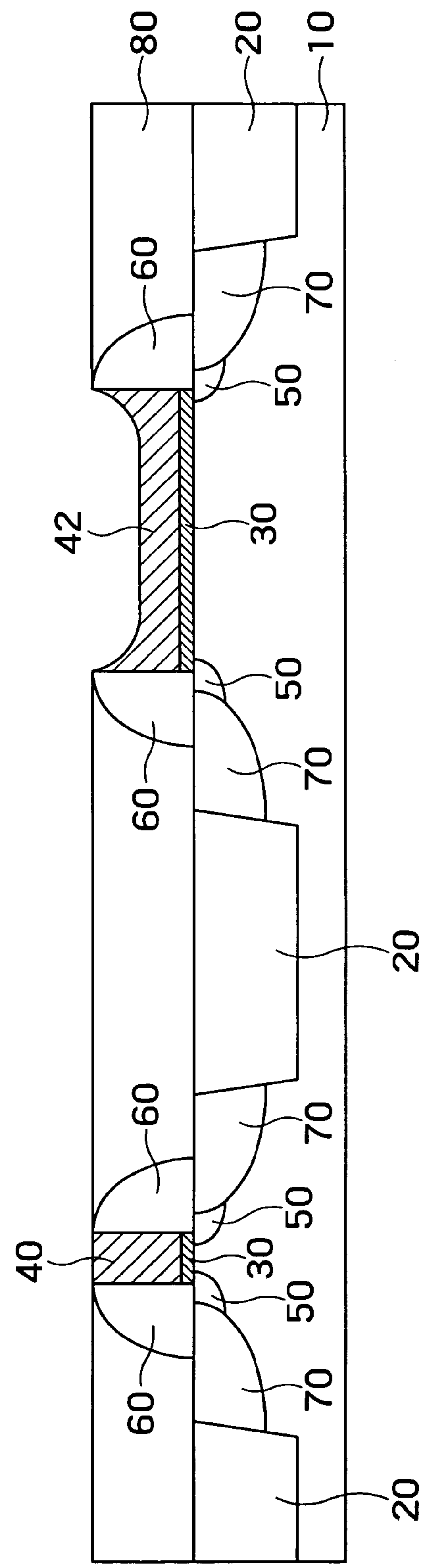
FIG. 14 is a cross-sectional diagram showing a method of manufacturing a semiconductor device following FIG. 13.
Figure 15:
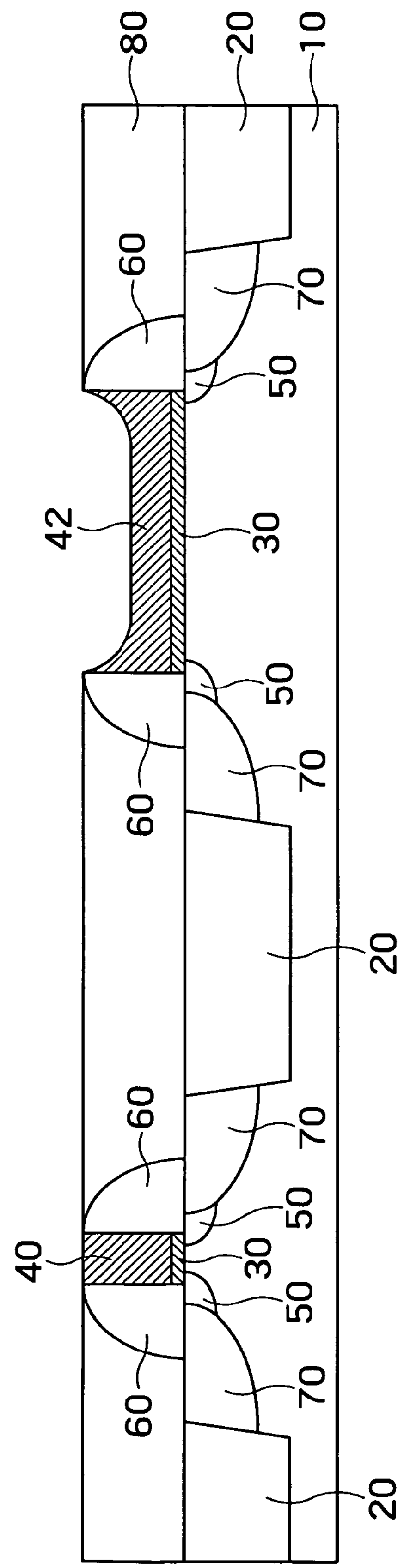
FIG. 15 is a cross-sectional diagram showing a method of manufacturing a semiconductor device following FIG. 14.

FIG. 13 to FIG. 15 are cross-sectional diagrams showing a flow of a method of manufacturing a semiconductor device according to a second embodiment of the present invention. According to the first embodiment, the second gate electrode 42 is etched using a photolithographic technique and anisotropic etching such as RIE. However, according to the second embodiment, the second gate electrode 42 is ground according to CMP without using the photolithographic technique.

First, the configuration shown in FIG. 1 is obtained through a process similar to that according to the first embodiment. Next, as shown in FIG. 13, silicon CMP is carried out to the first and the second gate electrodes. Depending on conditions of the CMP, a larger area is ground fast by CMP, and a smaller area is hardly ground by CMP. Therefore, as shown in FIG. 14, the second gate electrode 42 is ground and dished faster than the first gate electrode 40. On the other hand, the first gate electrode 40 is hardly ground.

A nickel film (not shown) is deposited as a silicide metal film. The first and the second gate electrodes 40 and 42 react with the nickel film in an annealing process. As a result, both the first and the second gate electrodes 40 and 42 can be fully silicided as shown in FIG. 15. Thereafter, a semiconductor device may be completed in a manufacturing process similar to that according to the first embodiment. The semiconductor device according to the second embodiment has effect similar to that according to the first embodiment.

Third Embodiment

Figure 16:
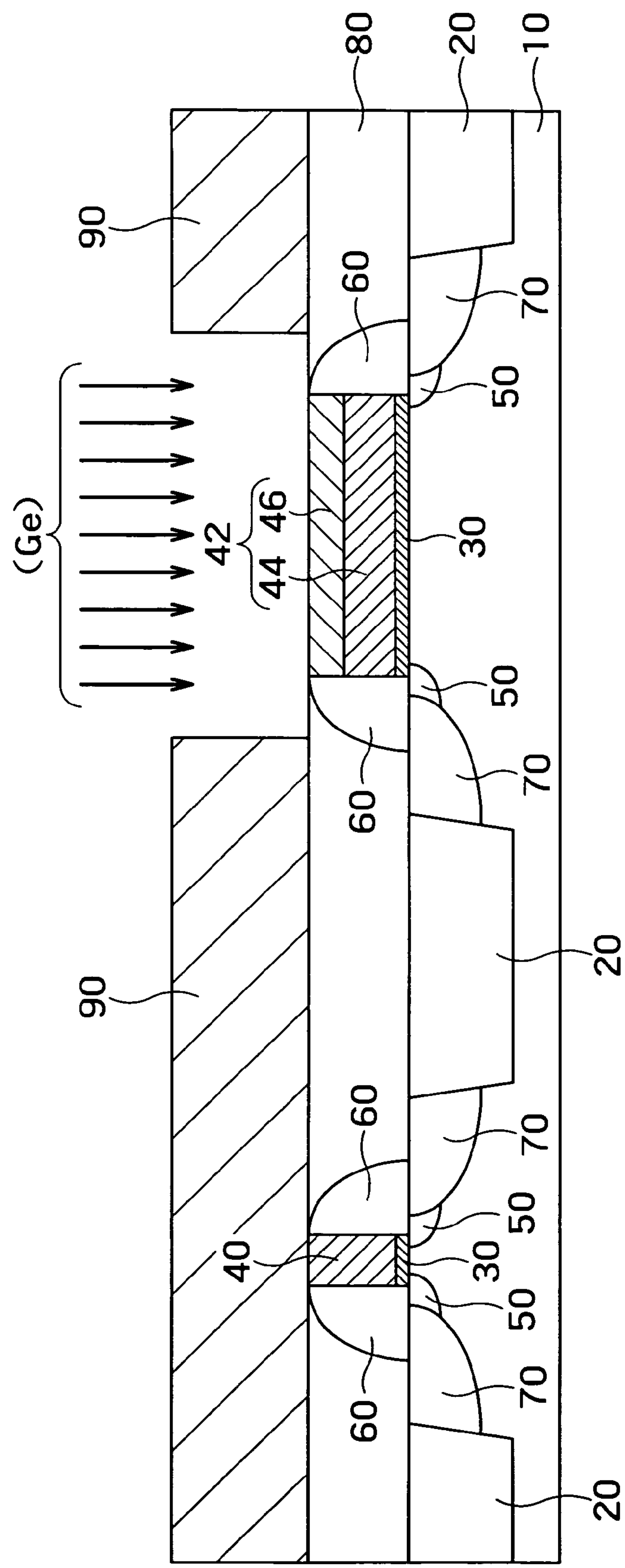
FIG. 16 is a cross-sectional diagram showing a method of manufacturing a semiconductor device according to a third embodiment of the present invention.
Figure 17:
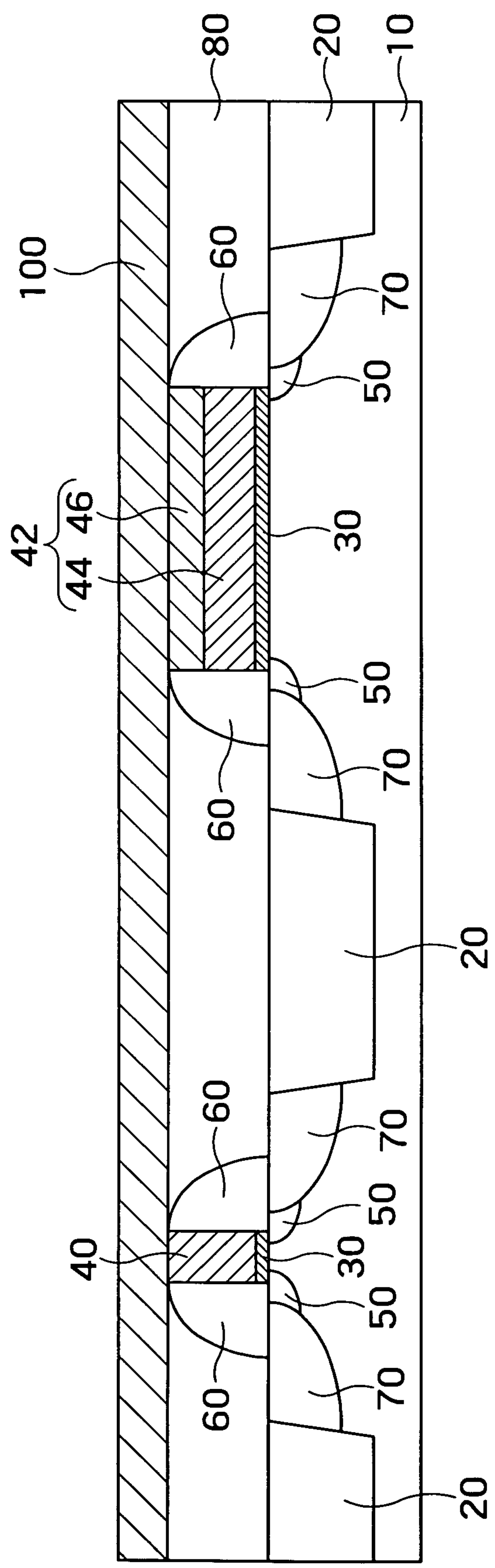
FIG. 17 is a cross-sectional diagram showing a method of manufacturing a semiconductor device following FIG. 16.

FIG. 16 and FIG. 17 are cross-sectional diagrams showing a flow of a method of manufacturing a semiconductor device according to a third embodiment of the present invention. First, the configuration as shown in FIG. 1 is obtained in a process similar to that according to the first embodiment. Next, the photoresist 90 is deposited as a mask material on the first and the second gate electrodes 40 and 42, respectively. As shown in FIG. 16, the photoresist 90 is patterned to expose the upper surface of the second gate electrode 42 while keeping the first gate electrode 40 covered with the photoresist 90. Germanium ions or silicon ions, for example, are implanted using the photoresist 90 as a mask. As a result, an upper part of the second gate electrode 42 is made amorphous. With this arrangement, the second gate electrode 42 has a two-layer configuration including a polysilicon layer 44 and an amorphous silicon layer 46.

The photoresist 90 is removed, and the nickel film 100 is deposited, as shown in FIG. 17. The first and the second gate electrodes 40 and 42 are reacted with the nickel film 100 in an annealing process, thereby forming nickel silicide as a gate electrode. In this case, the first gate electrode 40 has the amorphous silicon layer 46 on its upper part, although the area is large. The amorphous silicon layer 46 is more easily silicided than polysilicon. Therefore, both the first and the second gate electrodes 40 and 42 are fully silicided, although their areas are different. As a result, the configuration as shown in FIG. 9 is obtained. Thereafter, a semiconductor device may be completed in a manufacturing process similar to that according to the first embodiment. According to the third embodiment, effect similar to that by the first embodiment is obtained.

Modification of the Third Embodiment

According to a modification of the third embodiment, a silicide layer (not shown) can be formed on the source/drain layer 70. In this case, the first and the second gate electrodes 40 and 42 are covered with a mask material, and the silicide layer 110 is formed on the source/drain layer 70. After that, the inter-layer insulation film 80 is flattened to expose the upper surfaces of the first and the second gate electrodes 40 and 42. The first gate electrode 40 is covered by a mask material, and germanium ion or silicon ion is implanted into the second gate electrodes 42. As a result, an upper part of the second gate electrode 42 is made amorphous. With this arrangement, the second gate electrode 42 has a two-layer configuration including the polysilicon layer 44 and the amorphous silicon layer 46. Thereafter, a semiconductor device may be completed in a process similar to that according to the third embodiment.

Fourth Embodiment

Figure 18:
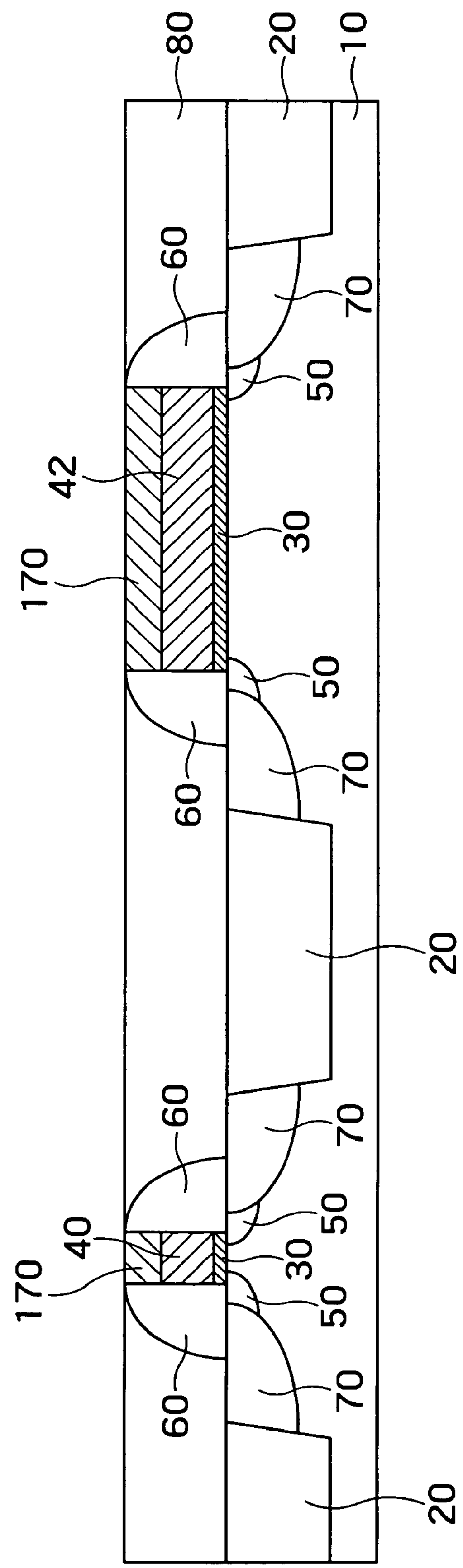
FIG. 18 is a cross-sectional diagram showing a method of manufacturing a semiconductor device according to a fourth embodiment of the present invention.

FIG. 18 to FIG. 21 are cross-sectional diagrams showing a flow of a method of manufacturing a semiconductor device according to a fourth embodiment of the present invention. First, the gate insulation film 30 is formed on the silicon substrate 10 in a process similar to that according to the first embodiment. Next, polysilicon and silicon nitride films are deposited on the gate insulation film 30. The polysilicon film and the silicon nitride film are formed in a gate pattern using a photolithographic technique and anisotropic etching such as RIE. As a result, the first and the second gate electrodes 40 and 42 and a silicon nitride film cap 170 are formed, as shown in FIG. 18. The silicon nitride film cap 170 covers the upper surfaces of the first and the second gate electrodes 40 and 42, respectively.

Figure 19:
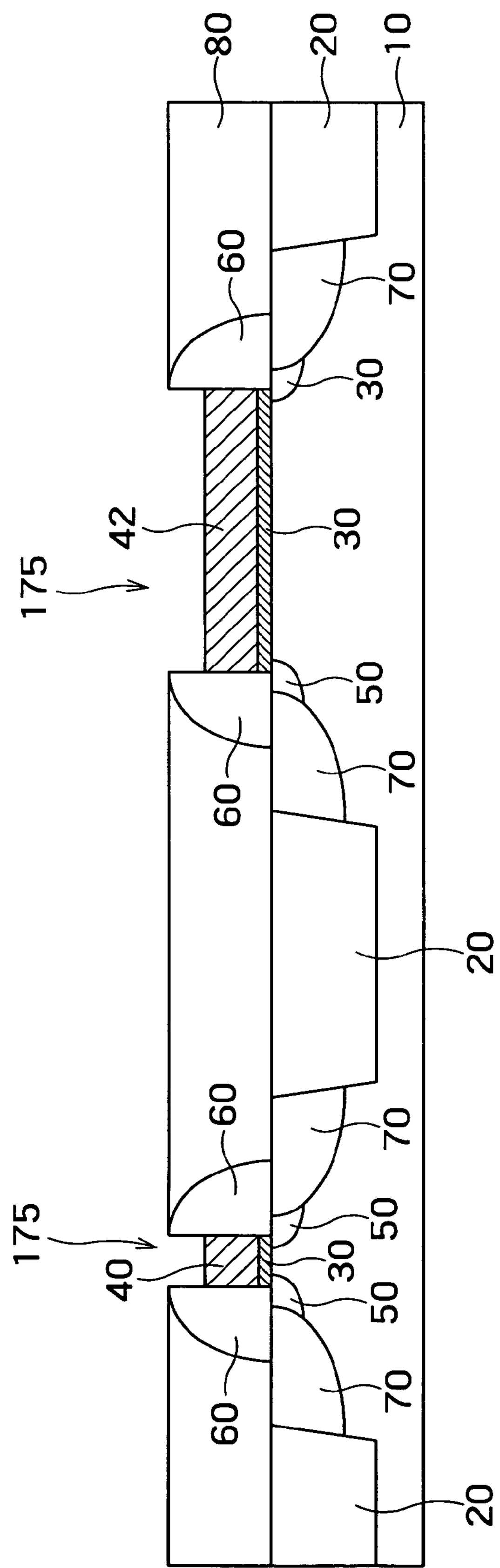
FIG. 19 is a cross-sectional diagram showing a method of manufacturing a semiconductor device following FIG. 18.
Figure 20:
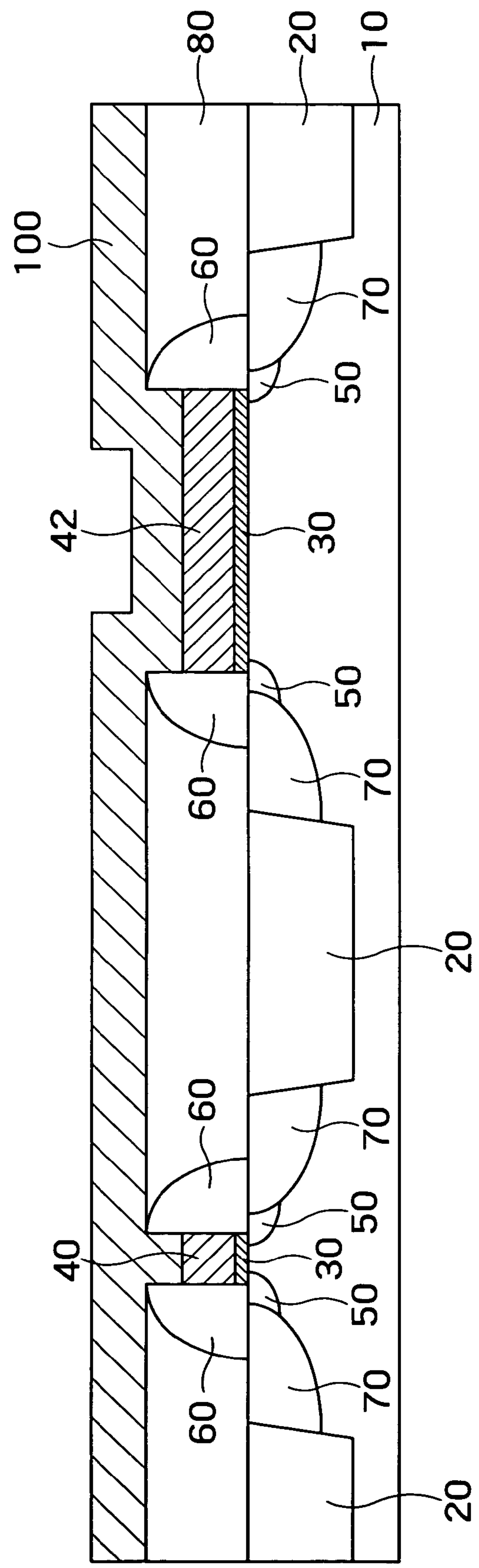
FIG. 20 is a cross-sectional diagram showing a method of manufacturing a semiconductor device following FIG. 19.

After forming sidewalls 60, the silicon nitride film cap 170 is etched using thermal phosphoric solution or RIE as shown in FIG. 19. As a result, a trench 175 is formed at a position where the silicon nitride film cap 170 is present. The nickel film 100 is deposited as a metal film, as shown in FIG. 20.

Figure 21:
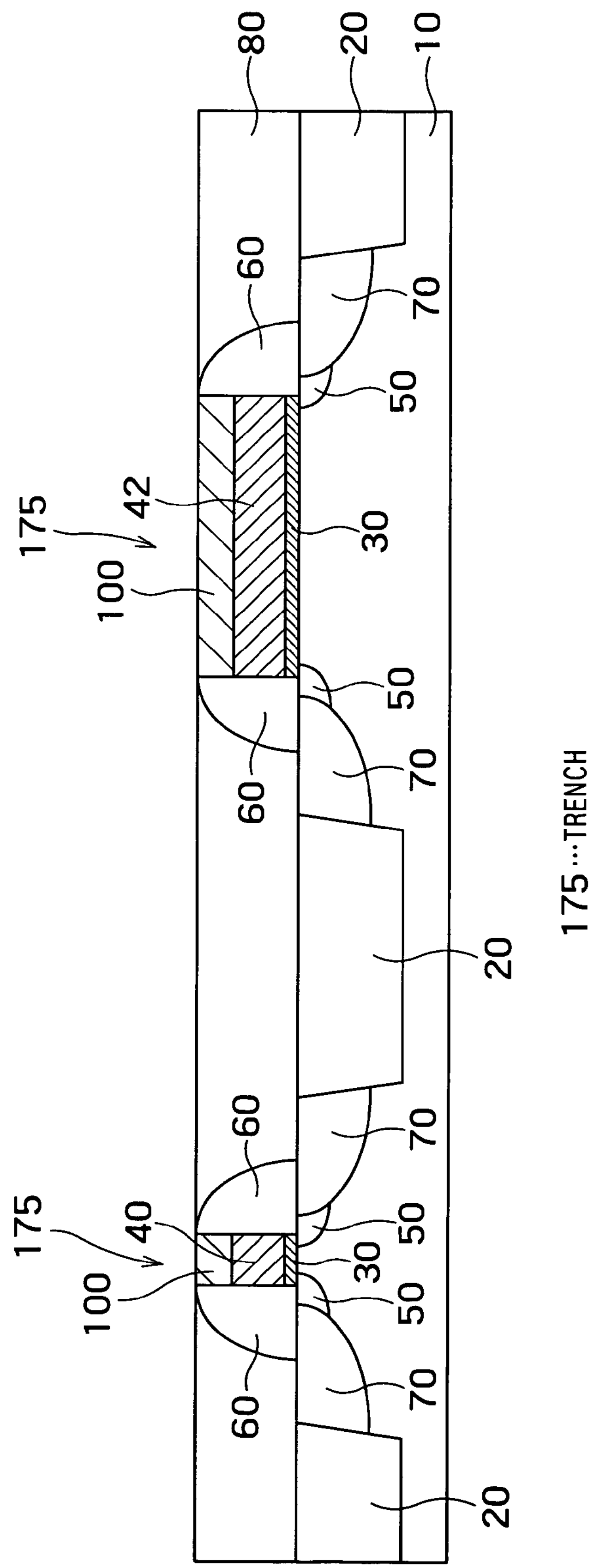
FIG. 21 is a cross-sectional diagram showing a method of manufacturing a semiconductor device following FIG. 20.

The nickel film 100 is flattened by using CMP, as shown in FIG. 21. As a result, the nickel film 100 that is present at the outside of the trench 175 is removed, and the nickel film 100 within the trench 175 remains. The first and the second gate electrodes 40 and 42 are reacted with the nickel film 100 in an annealing process, thereby nickel silicide is formed as a gate electrode. The quantity of the nickel film 100 within the trench 175 needs to be sufficient enough to silicide the first and the second gate electrodes 40 and 42. According to the present embodiment, nickel is not supplied from the surrounding of the first and the second gate electrodes 40 and 42. Therefore, a ratio of the quantity of polysilicon to the quantity of nickel of the nickel film 100 is constant regardless of a gate pattern in the first and the second gate electrodes 40 and 42, respectively. In order to change the ratio of the quantity of polysilicon to the quantity of nickel of the nickel film, only the thickness of the silicon nitride film cap 170 shown in FIG. 18 is changed. In other words, when the thickness of the silicon nitride film cap 170 is controlled, a ratio of the quantity of polysilicon to the quantity of nickel of the nickel film can be determined so that the first and the second gate electrodes 40 and 42 can be fully silicided.

The configuration as shown in FIG. 9 is obtained through the above process. The subsequent manufacturing process may be similar to that according to the first embodiment. As a result, a semiconductor device is completed. The semiconductor device according to the fourth embodiment has effect similar to that according to the first embodiment.

Fifth Embodiment

Figure 22:
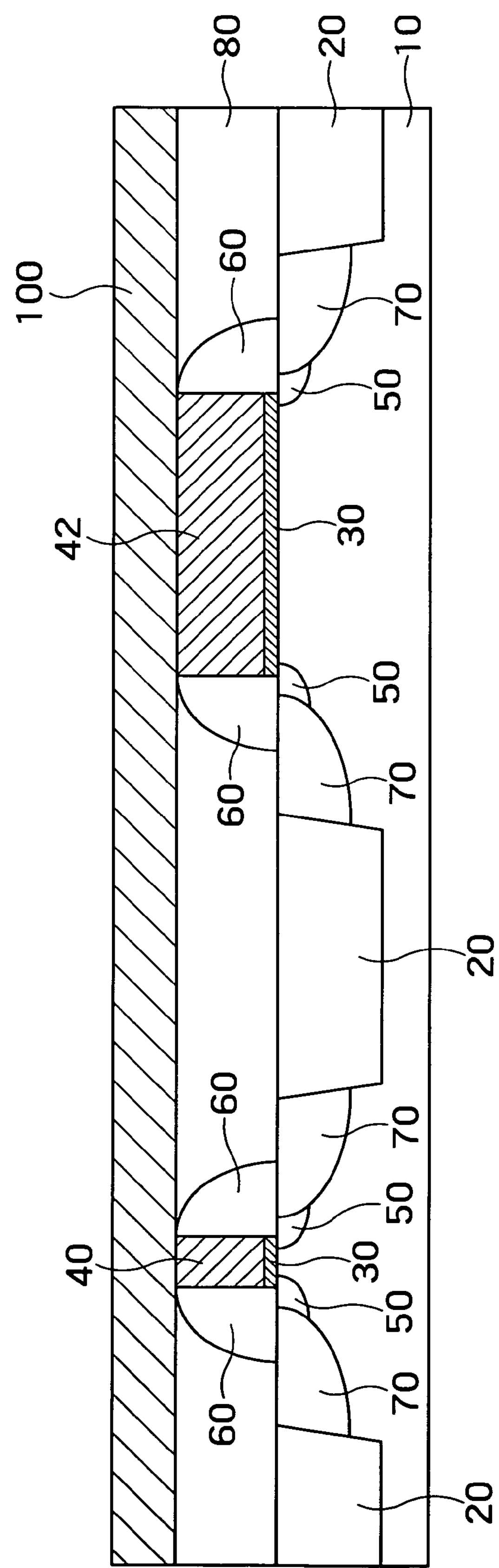
FIG. 22 is a cross-sectional diagram showing a method of manufacturing a semiconductor device according to a fifth embodiment of the present invention.
Figure 23:
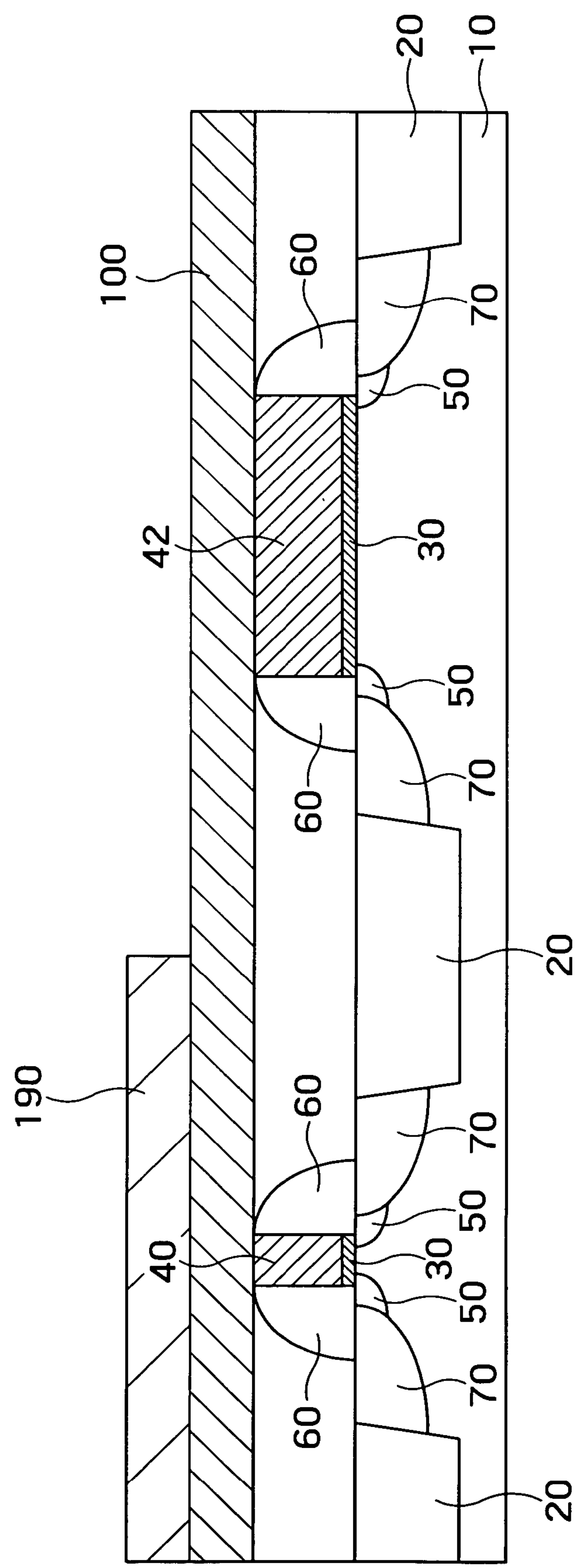
FIG. 23 is a cross-sectional diagram showing a method of manufacturing a semiconductor device following FIG. 22.
Figure 24:
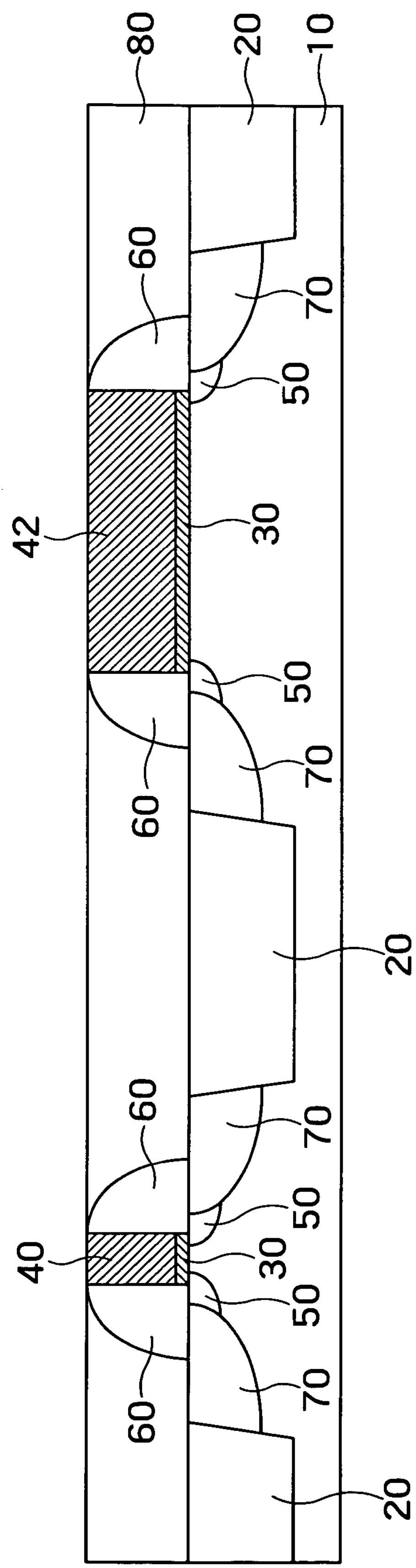
FIG. 24 is a cross-sectional diagram showing a method of manufacturing a semiconductor device following FIG. 23.

FIG. 22 to FIG. 24 are cross-sectional diagrams showing a flow of a method of manufacturing a semiconductor device according to a fifth embodiment of the present invention. First, the configuration as shown in FIG. 1 is obtained in a manufacturing process similar to that according to the first embodiment. Next, the nickel film 100 is deposited as a metal film, as shown in FIG. 22.

Next, as shown in FIG. 23, a titanium nitride film 190, for example, is deposited as a heat shielding film. The titanium nitride film 190 is patterned to cover the nickel film 100 on the second gate electrode 42 and to expose the nickel film 100 on the second gate electrode 42 using a photolithographic technique and etching.

The first and the second gate electrodes 40 and 42 are reacted with the nickel film 100 in an annealing process, thereby forming nickel silicide as a gate electrode, as shown in FIG. 24. I this silicidation process, it is preferred that a lamp heating apparatus or a light heating apparatus is used to facilitate the controlling of the silicidation. In this process, both the first and the second gate electrodes 40 and 42 are fully silicided. This is because the shielding of heat by the titanium nitride film 190 restricts the first gate electrode 40 from being silicided. As a result, the silicidation of the first and the second gate electrodes 40 and 42 proceeds uniformly.

The titanium nitride film 190 is removed next. Preferably, the nickel film 100 and the titanium nitride film 190 that remain are also removed at the same time. The nickel film 100 and the titanium nitride film 190 can be removed by treating them (SH processing) using hydrogen peroxide solution and sulfuric acid solution, for example. Thereafter, a semiconductor device is completed in a process similar to that according to the first embodiment. The semiconductor device according to the fifth embodiment has effect similar to that according to the first embodiment.

The heat shielding film 190 is not limited to titanium nitride, and preferably does not react with the metal film 100, for example, nickel. This is because when the heat shielding film 190 reacts with the metal film 100, the metal film 100 is corroded. Preferably, the heat shielding film 190 is made of a material that is dissolved in hydrogen peroxide solution and sulfuric acid solution. This is because the metal film 100 and the heat shielding film 190 can be removed through the same process after silicide is formed.

In the first to the fifth embodiments, in order to control the threshold voltage of transistors, impurities may be introduced into polysilicon that becomes a material of the first and the second gate electrodes, before the polysilicon is formed in a gate pattern.

The material of the first and the second gate electrodes 40 and 42 may be amorphous silicon. However, according to the third embodiment, the material of the first and the second gate electrodes 40 and 42 needs to be polysilicon.

The metal film 100 is not limited to nickel, and can be titanium (Ti), cobalt (Co), platinum (Pt), tungsten (W), erbium (Er), or yttrium (Y), for example.

The gate insulation film 30 may be a high dielectric film, an oxide film of the high dielectric film, or an oxinitride film of the high dielectric film that is different from the materials explained above.

In the process of flattening the inter-layer insulation film 80, etching according to CMP may be stopped in a state that the silicon oxide film slightly remains on the upper surface of the first and the second gate electrodes 40 and 42, and the rest of the silicon oxide film may be removed by etching such as RIE.

While the above embodiments are applied to a plane transistor, the embodiments may be also applied to transistors in which channels and gate electrodes are in a three-dimensional configuration such as fin-type transistors.

The transistors according to the above embodiments can be manufactured on a silicon-on-insulator substrate.

The invention claimed is:

1. A method of manufacturing a semiconductor device comprising:

forming a gate insulation film on a semiconductor substrate;

forming a first gate electrode and a second gate electrode on the gate insulation film, the area of the second gate electrode on the surface of the semiconductor substrate being larger than that of the first gate electrode;

selectively etching or grinding an upper part of the second gate electrode so that the thickness of the second gate electrode becomes smaller than the thickness of the first gate electrode;

depositing a metal film on the first gate electrode and the second gate electrode; and siliciding the whole of the first gate electrode and the whole of the second gate electrode in a same siliciding process.

2. The method of manufacturing a semiconductor device according to claim 1 further comprising:

forming a mask material so as to expose an upper surface of the second gate electrode while keeping the first gate electrode covered after forming the first and the second gate electrode and before etching the second gate electrode, wherein the upper part of the second gate electrode is etched selectively by dry etching.

3. The method of manufacturing a semiconductor device according to claim 1 further comprising, after forming the first and the second gate electrodes:

depositing an inter-layer insulation film on the first and the second gate electrodes; and planarizing the inter-layer insulation film to expose upper surfaces of the first and the second gate electrodes, wherein the upper part of the second gate electrode is ground selectively by CMP.

4. The method of manufacturing a semiconductor device according to claim 1, wherein the metal film is made of nickel (Ni).

5. The method of manufacturing a semiconductor device according to claim 1 further comprising, after forming the first and the second gate electrodes:

forming spacers on sidewalls of the first and the second gate electrodes;

forming source/drain layers on both sides of the first and the second gate electrodes;

depositing a metal on the source/drain layers; and forming silicide on the source/drain layers.

* * * * *